(12) United States Patent
Karthaus

(10) Patent No.: US 8,599,055 B1
(45) Date of Patent: Dec. 3, 2013

(54) DIGITAL-TO-ANALOG CONVERTER

(75) Inventor: Udo Karthaus, Neu-ulm (DE)

(73) Assignee: KATHREIN-Werke KG, Rosenheim (DE)

( * ) Notice: Subject to any disclaimer, the term of this patent is extended or adjusted under 35 U.S.C. 154(b) by 0 days.

(21) Appl. No.: 13/556,414

(22) Filed: Jul. 24, 2012

(51) Int. Cl.
*H03M 1/66* (2006.01)

(52) U.S. Cl.
USPC .............................. 341/144; 341/143; 341/155

(58) Field of Classification Search
USPC .......................................... 341/143, 144, 155
See application file for complete search history.

(56) References Cited

U.S. PATENT DOCUMENTS

| | | | | |
|---|---|---|---|---|
| 5,389,778 A | * | 2/1995 | Shinomiya | 250/214 R |
| 5,729,230 A | * | 3/1998 | Jensen et al. | 341/143 |
| 6,831,497 B2 | * | 12/2004 | Koh et al. | 327/254 |
| 7,034,728 B2 | * | 4/2006 | Luh et al. | 341/143 |
| 7,136,001 B2 | * | 11/2006 | Hode et al. | 341/143 |
| 7,383,034 B2 | * | 6/2008 | Shima et al. | 455/326 |
| 7,847,650 B2 | * | 12/2010 | Yao et al. | 331/167 |
| 7,902,934 B2 | * | 3/2011 | Nakamura et al. | 331/181 |
| 2005/0200510 A1 | * | 9/2005 | Yoshida et al. | 341/155 |
| 2006/0038708 A1 | * | 2/2006 | Luh et al. | 341/143 |
| 2008/0062022 A1 | | 3/2008 | Melanson | |
| 2010/0248647 A1 | * | 9/2010 | Wachi | 455/73 |
| 2011/0241920 A1 | * | 10/2011 | Mori | 341/153 |
| 2012/0293265 A1 | * | 11/2012 | Heikkinen et al. | 330/291 |

* cited by examiner

*Primary Examiner* — Linh Nguyen
(74) *Attorney, Agent, or Firm* — Stephen H. Eland; Dann, Dorfman, Herrell & Skillman

(57) ABSTRACT

A digital-to-analog converter (10) is described which comprises at least one cell (301). The cell (301) has a first coupling capacitor (415) with a second terminal connected to an output and a first inverter (405, 410) connected between a bias voltage and ground. The gates of the field effect transistors (405, 410) forming the first inverter are connected to a data input (305) and a first common point between the field effect transistors (405, 410) is connected to a first terminal of the first coupling capacitor (415).

8 Claims, 3 Drawing Sheets

201-2 …, 201-n that are connected to a differential output 255. For simplicity, the circuit is only shown for one of the cells 201-1, 201-2 …, 201-n. FIG. 2 shows, however, that there are outputs for each of the cells 201-1, 201-2 …, 201-n which are then added together to form the differential output 255.

DIGITAL-TO-ANALOG CONVERTER

CROSS-REFERENCE TO RELATED APPLICATIONS

None

FIELD OF THE INVENTION

The field of the application relates to a digital-to-analog converter for converting digital signals to analog signals. The digital-to-analog converter can be used in the feedback loop of a band-pass delta-sigma modulator.

BACKGROUND OF THE INVENTION

Delta-sigma modulation is a method for converting analog signals into digital signals. The modulation is done using error feedback through a feedback loop in which the difference between the input (analog) signal and the output (digital) signal is measured using a digital-to-analog converter in the feedback loop. The measured difference is used to improve the conversion. Delta-sigma modulation has found increasing use in modern electronic components, such as mobile telecommunications equipment and audio equipment.

FIG. 1 shows an example of a delta-sigma modulator 10, as known in the art. The delta-sigma modulator 10 has a radio frequency (RF) input 20 and, in this example, has three stages, i.e. is a third order delta-sigma modulator. The number of stages can vary depending on the frequency of the input signal at the RF input 20 and the required accuracy of the output signal at the digital output 140. In FIG. 1, each one of the three stages comprises a resonator 40, 60 and 80, a transconductance element 35, 55 and 75 as well as a digital-to-analog converter 110, 112, 114.

The resonators are shown here as a first resonator 40, a second resonator 60, and a third resonator 80. The RF input 20 is connected to the first transconductance element 35. The output of the first resonator 40 is added at a node 30 to the output of a first digital-to-analog converter 114 and the output of the first transconductance element 35. The sum of the currents at the first node 30 is thus the sum of the currents of the output of the first transconductance element 35, the first resonator 40 and the output of the first digital-to-analog converter 114. The first node 30 is connected to the input of the second transconductance element 55.

Similarly, a second node 50 is connected to the second resonator 60, the output of the second digital-to-analog converter 112 and the output of the second transconductance element 55. The second node 50 forms the input to the third transconductance element 75. Finally the third resonator 70, the output of the third digital-to-analog converter 110 and the output of the third transconductance element 75 are connected at a third node 70. The third node 70 forms the input to a quantizer 90 that is typically a flash ADC.

The first digital-to-analog converter 114, the second digital-to-analog converter 112, and the third digital-to-analog converter 110 each have their inputs connected to a feedback loop 120. As described above, the feedback loop 120 is used to provide an error feedback signal and thus improve the accuracy of the conversion of the analog RF input signal received at the RF input 20 to the digital output signal at the digital output 150.

FIG. 2 shows an example of a prior art digital-to-analog converter 200 which is used in the circuit of FIG. 1 as the digital-analog converters 112, 114, 116. The digital-analog converter 200 of FIG. 2 comprises a plurality of cells 201-1, The illustrated cell 201-1 shows a data terminal 205 and an inverted data terminal 210 which receive data from the digital output 150 of delta-sigma modulator 10. The data terminal 205 is connected to a gate 215$g$ of a first field effect transistor (FET) 215. The inverted data terminal 210 is connected to a gate 220$g$ of a second FET 220. Source 215$s$ of the first FET 215 and source 220$s$ of the second FET 220 are commonly connected to a drain 235$d$ of a third FET 235 and through the source 235$s$ of the third FET 235 to a resistor 240 and subsequently to ground 245. The third FET 235 and the resistor 240 form a current source through which current is flowing. This flowing current leads to noise in the analog-digital converter 200. There may also be a mismatch in the channel (215$s$-215$d$) of the first FET 215 and the channel (220$s$-220$d$) of the second FET 200 due to process variations that can affect the operation of the digital-analog converter 200.

Gate 235$g$ of the third FET 235 is connected to a bias 230. The drain 220$d$ of the second FET 220 is connected to a first terminal 255-1 of the differential output 255, and the drain 215$d$ of the first FET 215 is connected to a second terminal 255-2 of the differential output 255.

The digital-analog converter 200 has also a load circuit 260 connected across the differential output 255. The load circuit 260 comprises a first capacitor 265 with one side connected to ground 270, and a second capacitor 275 with one side connected to the ground 270. The other side of the first capacitor 265 and the other side of the second capacitor 275 are connected to through an inductor 285 to a supply voltage $V_{cc}$ 280.

The output signal is formed by the current multiplied by duration of the bits at the data inputs 205 and 210

The digital-analog converter 200 shown in FIG. 2 is DC-coupled and permanently injects noise into the load in the current source including the resistor 240 that is then fed back into the delta-sigma modulator 10 through the feedback loop 120. The output current of the digital-analog converter 200 depends non-linearly on the drain voltage of the first FET 205 and the second FET 220 that can cause intermodulation due to difference in the channels of the first FET 205 and the second FET 220.

There may also be mismatch between the cells 201-1, 201-2 …, 201-n of the digital-analog converter 200 because of manufacturing tolerances. This mismatch may lead to non-linearity of the digital-analog converter 200. In particular it will be noted that the third FET 235 which forms part of the current source may have a size of a few square micrometers and thus changes in size due to processing issues can be significant.

One known solution for avoiding the injection of noise into the load is to use an AC-coupled feedback path, as disclosed in United States Patent Application Publication No. US 2008/0062022 (Melanson) which discloses a delta-sigma modulator having an AC-coupled feedback path to reduce signal level in the loop filter. The delta-sigma modulator of the Melanson application has at least to feedback paths corresponding to integrators. In the disclosure of Melanson, one of the feedback paths from the quantizer output is DC-coupled, and another one of the feedback path is AC-coupled.

SUMMARY OF THE INVENTION

A digital-to-analog converter is described which comprises at least one cell. The cell has a first coupling capacitor with a second terminal connected to an output and a first inverter connected between a bias voltage and ground. The gates of the field effect transistors forming the first inverter are connected to a data input and a first common point between the field effect transistors is connected to a first terminal of the first coupling capacitor. The digital-to-analog converter has no current source and, as a result, the only noise source is due to the thermal noise voltage of the on-resistance of the field effect transistors forming the inverter.

The output can be either single ended or a differential output. The aspect of the differential output for the digital-to-analog converter requires a second inverter connected between the bias voltage and ground. The gates of the field effect transistors forming the second inverter are connected to an inverted data input and a second common point between the field effect transistors is connected to a first terminal of a second coupling capacitor. The differential output is formed between a second side of the first coupling capacitor and a second side of the second coupling capacitor.

A resonator can be added to the digital-to-analog converter. The resonator comprises a third capacitor connected between the second side of the first coupling capacitor and ground, a fourth capacitor connected between the second side of the second coupling capacitor and ground and an inductor connected between the second side of the first coupling capacitor and the second side of the second coupling capacitor and having a RF ground tap.

The digital-to-analog converter may have a plurality of cells with the outputs being commonly connected to increase the resolution of the converter.

The digital-to-analog converter may be used in a delta sigma modulator

DETAILED DESCRIPTION OF THE INVENTION

The invention will be described on the basis of the drawings. It will be understood that the embodiments and aspects of the invention described herein are only examples and do not limit the protective scope of the claims in any way. The invention is defined by the claims and their equivalents. It will be understood that features of one aspect or embodiments of the invention can be combined with the feature of a different aspect or aspects and/or embodiments of the invention.

Figure 1:
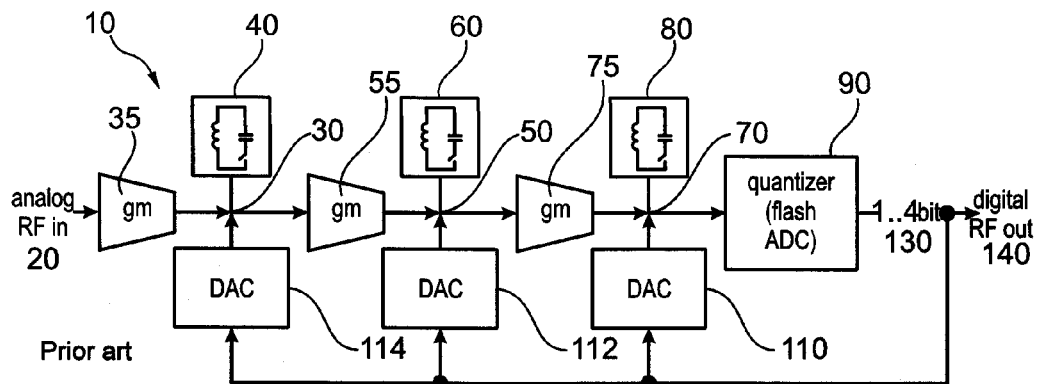
FIG. 1 shows a prior art delta-sigma modulator.
Figure 2:
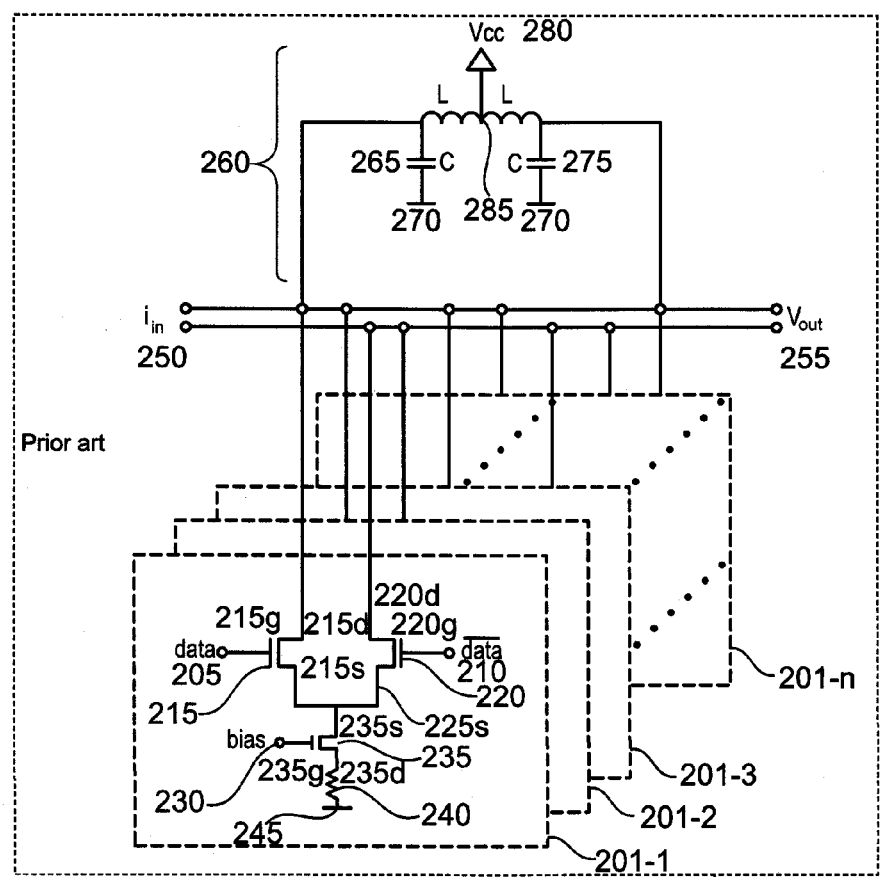
FIG. 2 shows a prior art digital-analog converter.
Figure 3A:
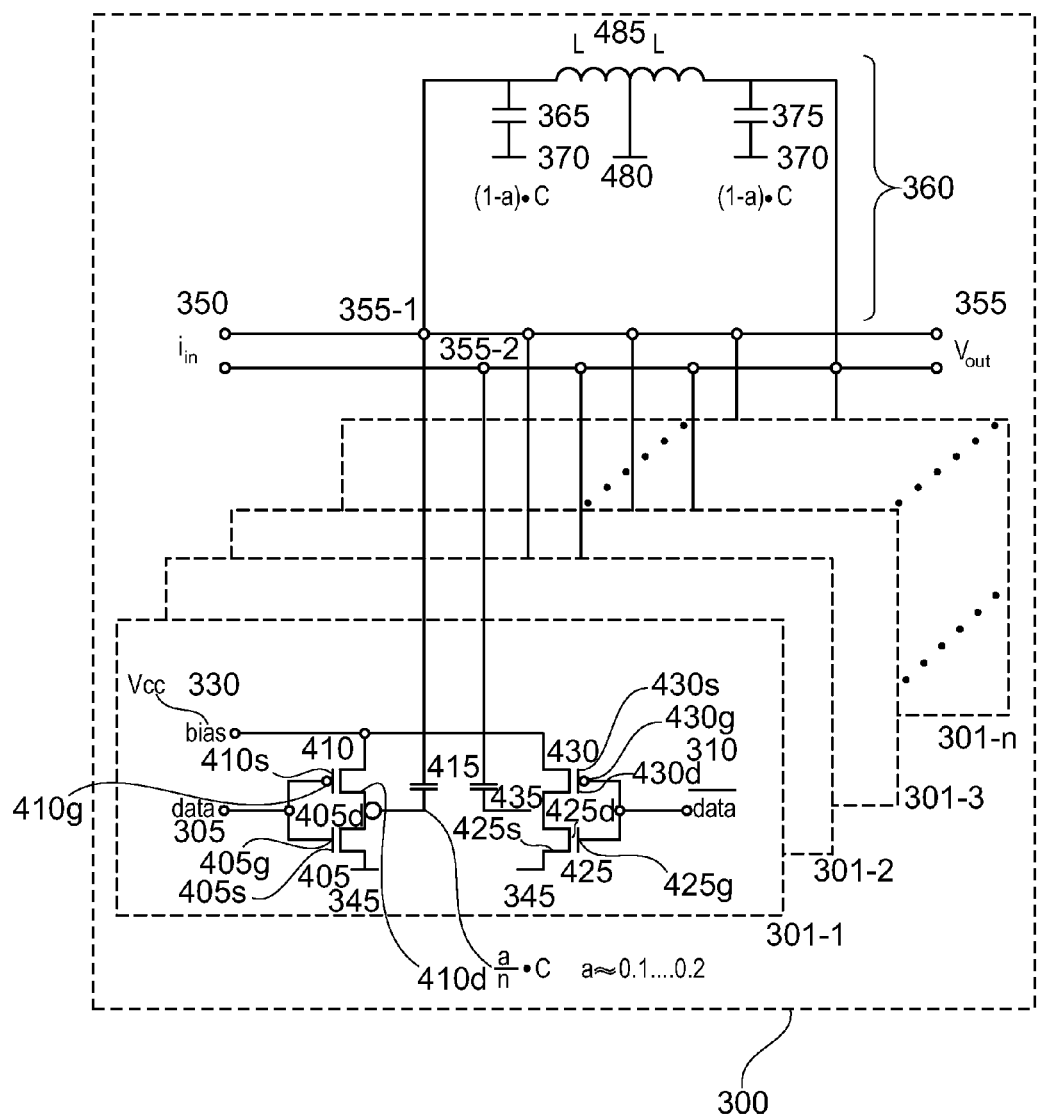
FIG. 3a shows an aspect of a digital-analog converter with a differential output.

FIG. 3a shows an example of a digital-analog converter 300 with a differential output 355 that can be used in the delta-sigma modulator 10 shown in FIG. 1. The digital-analog converter 300 of FIG. 3a comprises a plurality of cells 301-1, 301-2 . . . , 301-n, similar to the digital-analog converter 200 of FIG. 2. Only the circuit in one of the plurality of the cells 301-1, 301-2 . . . , 301-n is shown for clarity.

The cell 301-1 shown in the figure will now be described in more detail. It will be seen that the cell has two inverters. The first of the inverters is a push-pull switch-mode power amplifier and comprises a fourth FET 405 and a fifth FET 410. Drain 405d of the fourth FET 405 and drain 410d of the fifth FET 410 are commonly connected. The source 405s of the fourth FET 405 is connected to ground 345. A gate 405g of the fourth FET 405 is connected to a data terminal 305, such that the fourth FET is "on" (i.e. conducting) when the input at the data terminal 305 is high. The data terminal 305 is also connected to a gate 410g of the fifth FET 410, such that the fifth FET 410 is "on" (i.e. conducting) when the input at the data terminal 305 is low. The common point between the drain 405d of the fourth FET 405 and the drain 410d of the fifth FET 410 is connected to a first side of a first coupling capacitor 415 and forms the output. The source 410s of the fifth FET 410 is connected to the bias voltage at 330. In this aspect of the system the bias voltage is the supply voltage $V_{cc}$.

Similarly, the second one of the inverters comprises a sixth FET 425 and a seventh FET 430. Drain 425d of the sixth FET 425 and drain 430d of the seventh FET 430 are commonly connected to each other and to one side of a second coupling capacitor 435. The source 425s of the sixth FET 425 is connected to ground at 345. The source 430s of the seventh FET 430 is connected to the bias voltage at 330. A gate 425g of the sixth FET 425 is connected to a data terminal 310, such that the sixth FET 425 is "on" (conducting) when the input at the data terminal 310 is high. The data terminal 310 is also connected to A gate 430g of the seventh FET 430, such that the seventh FET 430 is on when the input at the data terminal 310 is low.

The fourth FET 405 and the sixth FET 425 are made of nMOS transistors in this aspect of the system. The fifth FET 410 and the seventh FET 430 are made of pMOS transistors in this aspect of the system. This is, however, not limiting of the system.

The other side of the first coupling capacitor 415 is connected to a first line 355-1 of the differential output 355. The other side of second coupling capacitor 435 is connected to a second line 355-2 of the differential output 355. The values in this example of the first coupling capacitor 415 and the second coupling capacitor 435 are given as (a/n)·C, wherein a is a value between 0.1 and 0.2, and n is the number of unit cells the digital-analog converter 300. The output signal is therefore a voltage.

A load circuit 360 is connected between the two lines 355-1 and 355-2 of the differential output 355. The load circuit 360 comprises a third capacitor 365 with one side connected to ground 370 and the other side connected to the first line 355-1 of the differential output 355 at as well as to RF ground 480 through an inductor 485. The load circuit 360 includes a fourth capacitor 375 which is similar to the third capacitor 365, and has one side connected to ground 370 and the other side connected to the second line 355-2 of the differential output 355 and through the inductor 485 to one terminal of the third capacitor 365 and to the RF ground 480. It will be appreciated that the connection at 480 could also be to the supply voltage $V_{cc}$, rather than pure ground, although this may be more noisy. The inductor 485 could be formed of either two inductors with a common point connected to the RF ground 480 of by a single inductor 485 with a center tap connected to the RF ground 480.

The third capacitor 365, the fourth capacitor 375 and the inductor 485 commonly form a resonator.

The value of the third capacitor 365 and the fourth capacitor 375 is given by (1−a)·C. In other words, the total capacitance of the digital-analog converter 300 is given by the value of C. These values are merely examples and not limiting of the invention.

It will be appreciated that the digital-analog converter 300 shown in FIG. 3a can be used in the delta-sigma modulator 10 of FIG. 1. Furthermore, the digital-analog converter 300 may also find application in other fields.

The noise in the circuit 300 of FIG. 3 is due to the thermal noise of the on-resistance of the MOSFET transistors that form the first FET 215, the second FET 220, the third FET 235, the fourth FET 405, the fifth FET 410, the sixth FET 425 and the seventh FET 430. This thermal noise can be reduced by making the switches large. The current source formed by the transistor 235 and the (optional) source resist 240 of the prior art circuit of FIG. 2, on the other hand, permanently injects a noise current into the load of the prior art circuit.

The first coupling capacitor 265 and the second coupling capacitor 275 are responsible for injecting charge into the load. The first coupling capacitor 265 and the second coupling capacitor 275 are typically formed from metal-insulator-metal layers with a size of several hundred square micrometers. This is substantially larger than the size of the third FET 235 in the prior art digital-analog converter 200 and thus any errors due to manufacturing tolerances are substantially reduced.

The digital-to-analog converter of the description has been illustrated with a differential output. It will be appreciated that the output could be single-ended, as is shown in detail in FIG. 3b.

Figure 3B:
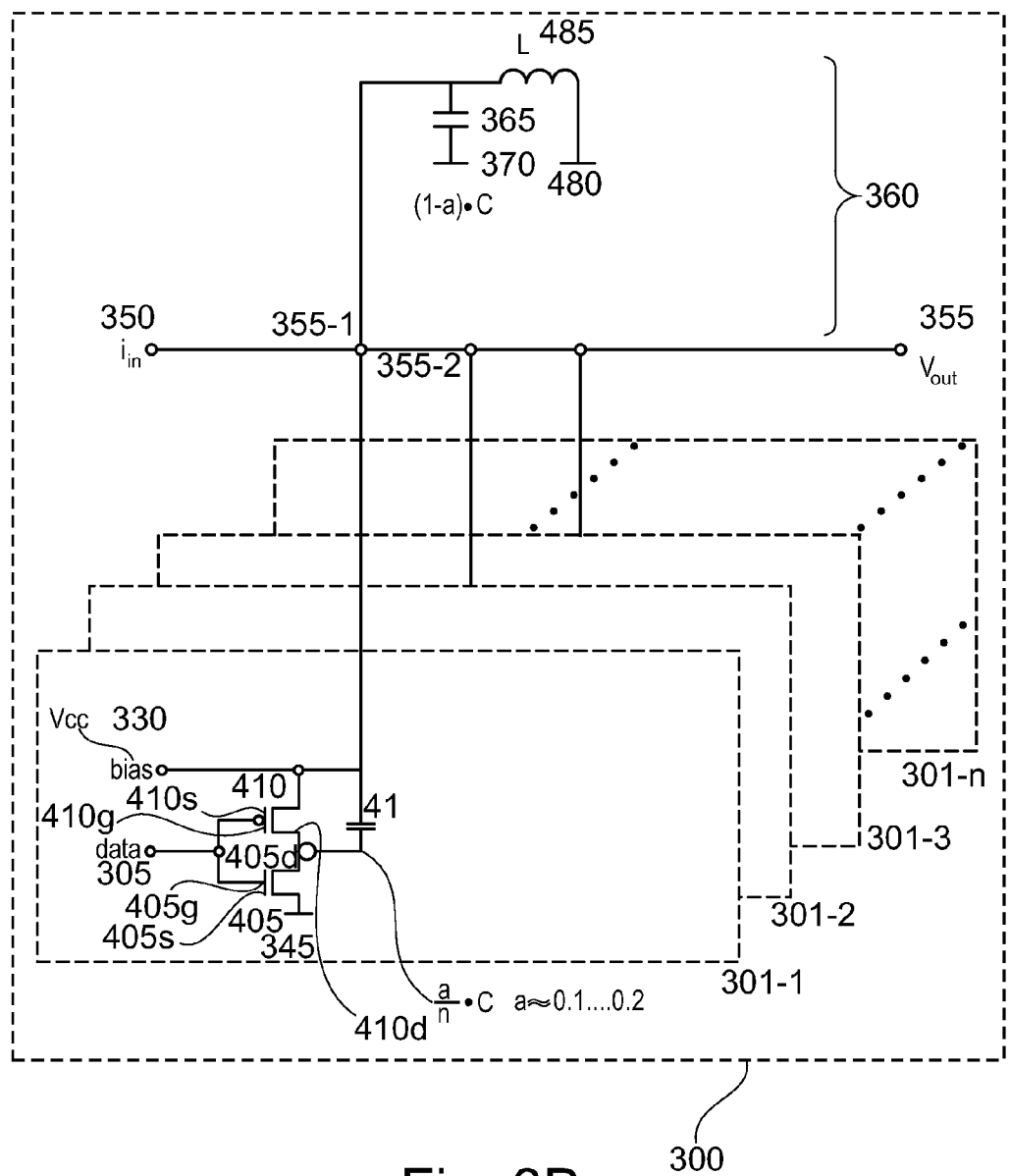
FIG. 3b shows an aspect of a single-ended digital-analog converter.

FIG. 3b uses the same reference numerals as FIG. 3a to indicate identical components. FIG. 3b shows a single-ended implementation of the digital-analog converter. The single-ended implementation functions in the same manner as the digital-to-analog converter with the differential output. It will be appreciated that the circuits shown in FIGS. 3a and 3b have MOSFET transistors. The circuit may be equally implemented using JFET, MESFET or HEMT transistors. In this case—unlike the MOSFET case—both of the fourth FET anf the fifth FET, are n-channel devices. So the terminal of labeled "410d" would then be a source (not drain), and the terminal of labeled "410s" would then be a drain (not source).

While various embodiments of the present invention have been described above, it should be understood that they have been presented by way of example, and not limitation. It will be apparent to persons skilled in the relevant arts that various changes in form and detail can be made therein without departing from the scope of the invention. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

REFERENCE NUMERALS

| | |
|---|---|
| 10 | Delta Sigma Modulator |
| 20 | RF Input |
| 30 | First Node |
| 35 | First Transconductance Element |
| 40 | First Resonator |
| 50 | Second Node |
| 55 | Second Transconductance Element |
| 60 | Second Resonator |
| 70 | Third Node |
| 75 | Third Transconductance Element |
| 80 | Third Resonator |
| 90 | Analog-Digital Converter (ADC) |
| 112 | Third digital to analog convertor |
| 114 | Second digital to analog convertor |
| 116 | First digital to analog convertor |
| 120 | Feedback Loop |
| 150 | Output |
| 200 | Prior Art Digital to Analog Converter |
| 201 | Cells |
| 205 | Data |
| 210 | Negative Data |
| 215 | First FET |
| 225 | Second FET |
| 230 | Bias Voltage |
| 235 | Third FET |
| 240 | Resistor |
| 245 | Ground |
| 250 | Input |
| 255 | Differential Output |
| 260 | Load Circuit |
| 265 | First Capacitor |
| 270 | Ground |
| 275 | Second Capacitor |
| 280 | Supply Voltage |
| 285 | Inductor |
| 300 | Digital to Analog Converter |
| 305 | Data |
| 310 | Negative Data |
| 345 | Ground |
| 350 | Input |
| 355 | Output |
| 360 | Load Circuit |
| 365 | Third Capacitor |
| 370 | Ground |
| 375 | Forth Capacitor |
| 405 | Fourth FET |
| 410 | Fifth FET |
| 415 | First Coupling Capacitor |
| 425 | Sixth FET |
| 430 | Seventh FET |
| 435 | Second Coupling Capacitor |
| 480 | RF Ground |
| 485 | Inductor |

The invention claimed is:

1. A digital-to-analog converter comprising at least one cell, the at least one cell having:
   a first coupling capacitor with a second terminal connected to an output;
   a first inverter connected between a bias voltage and ground, wherein gates of the first inverter are connected to a data input and a first common point is connected to a first terminal of the first coupling capacitor;

a second inverter connected between the bias voltage and ground, wherein the gates of the second inverter are connected to an inverted data input and a second common point is connected to a first terminal of a second coupling capacitor;
a differential output connected to a second side of the first coupling capacitor and a second side of the second coupling capacitor, wherein the differential output of at least one of the cells comprises
a third capacitor connected between the second side of the first coupling capacitor and ground;
a fourth capacitor connected between the second side of the second coupling capacitor and RF ground; and
an inductor connected between the second side of the first coupling capacitor and the second side of the second coupling capacitor and having a RF ground tap.

2. The digital-to-analog converter of claim 1, wherein the bias voltage is a supply voltage.

3. The digital-to-analog converter of claim 1, wherein the first inverter is a push-pull switch-mode power amplifier.

4. The digital-to-analog converter of claim 3, wherein the push-pull switch-mode power amplifier is realized using at least one of discrete or integrated MOS, JFET, MESFET or HEMT transistors.

5. The digital-to-analog converter of claim 1, where the inductor comprises
a first inductor connected between the second side of the first coupling capacitor and ground; and
a second inductor connected between the second side of the second coupling capacitor and ground; wherein
one terminal of the first inductor, one terminal of the second inductor and ground are commonly connected.

6. The digital-to-analog converter of claim 1 having a plurality of cells with the outputs being commonly connected.

7. The digital-to-analog converter of claim 2 having a plurality of cells with the differential outputs being commonly connected.

8. A delta sigma modulator comprising:
an input connected to at least one first transconductance element having an output connected to a node;
at least one resonator connected to the node;
at least one digital-to-analog converter with an output being connected to the node;
at least one second transconductance element with an input connected to the node and an output connected to an analog-to-digital converter; and
a feedback loop connected between the output of the analog-to-digital converter and the input of the at least one digital-to-analog converter, wherein the digital to analog converter comprises at least one cell, the at least one cell having:
a first coupling capacitor with a second terminal connected to the output;
a first inverter connected between a bias voltage and ground, and wherein gates of the first inverter are connected to a data input and a first common point is connected to a first terminal of the first coupling capacitor;
a second inverter connected between the bias voltage and ground, wherein the gates of the second inverter are connected to an inverted data input and a second common point is connected to a first terminal of a second coupling capacitor;
a differential output connected to a second side of the first coupling capacitor and a second side of the second coupling capacitor, wherein the differential output of at least one of the cells comprises
a third capacitor connected between the second side of the first coupling capacitor and ground;
a fourth capacitor connected between the second side of the second coupling capacitor and RF ground; and
an inductor connected between the second side of the first coupling capacitor and the second side of the second coupling capacitor and having a RF ground tap.

* * * * *